(12) United States Patent
Hu et al.

(10) Patent No.: US 8,204,091 B2
(45) Date of Patent: Jun. 19, 2012

(54) WAVELENGTH NORMALIZATION IN PHASE SECTION OF SEMICONDUCTOR LASERS

(75) Inventors: Martin Hai Hu, Painted Post, NY (US);
Dragan Pikula, Horseheads, NY (US);
Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 531 days.

(21) Appl. No.: 12/217,427

(22) Filed: Jul. 3, 2008

(65) Prior Publication Data
US 2010/0002736 A1   Jan. 7, 2010

(51) Int. Cl.
*H01S 3/13*   (2006.01)
(52) U.S. Cl. .............. 372/29.023; 372/29.02; 372/22; 372/21; 372/29.011; 372/29.016; 372/38.01
(58) Field of Classification Search .......... 372/29.023, 372/29.02, 22, 21, 29.011, 29.016, 38.01
See application file for complete search history.

(56) References Cited

U.S. PATENT DOCUMENTS

| | | | |
|---|---|---|---|
| 2,433,644 A | 12/1947 | Bennetch | 70/457 |
| 4,709,369 A | 11/1987 | Howard | 372/38 |
| 4,744,087 A | 5/1988 | Nicia | 372/38 |
| 4,796,267 A | 1/1989 | Yamada et al. | 372/38 |
| 4,912,717 A | 3/1990 | Takeuchi | 372/38 |
| 5,123,024 A | 6/1992 | Dowd et al. | 372/38 |
| 5,168,503 A | 12/1992 | Maeda | 372/22 |
| 5,220,578 A | 6/1993 | Koch et al. | 372/96 |
| 5,473,625 A | 12/1995 | Hansen et al. | 372/96 |
| 5,515,392 A | 5/1996 | Teremy | 372/38 |
| 5,835,650 A * | 11/1998 | Kitaoka et al. | 385/49 |
| 5,936,985 A | 8/1999 | Yamamoto et al. | 372/38 |
| 6,058,128 A | 5/2000 | Ventrudo | 372/96 |
| 6,069,904 A | 5/2000 | Kitaoka et al. | 372/32 |
| 6,215,809 B1 | 4/2001 | Ziari et al. | 372/96 |
| 6,222,861 B1 | 4/2001 | Kuo et al. | 372/20 |
| 6,229,832 B1 | 5/2001 | Baba et al. | 372/38.01 |
| 6,323,990 B1 | 11/2001 | Yamamoto et al. | 359/328 |
| 6,330,253 B1 | 12/2001 | Tuganov et al. | 372/9 |
| 6,389,046 B1 | 5/2002 | Stayt, Jr. et al. | 372/29.02 |
| 6,434,173 B1 | 8/2002 | Tuganov et al. | 372/9 |
| 6,560,253 B1 | 5/2003 | Munks et al. | 372/32 |

(Continued)

FOREIGN PATENT DOCUMENTS
EP    1703318 A1   9/2006
(Continued)

OTHER PUBLICATIONS

Santa Chawla, "Frequency stabilization of diode lasers," National Physical Laboratory Oct. 4, 2006 Articles 41.htm.

(Continued)

*Primary Examiner* — Kinam Park
(74) *Attorney, Agent, or Firm* — Gregory V. Bean

(57) ABSTRACT

Particular embodiments of the present invention relate generally to semiconductor lasers and laser projections systems and, more particularly, to schemes for controlling semiconductor lasers. According to one embodiment of the present invention, a laser having a gain section, a phase section and a wavelength selective section is configured for optical emission of encoded data. The optical emission is shifted across a plurality of laser cavity modes by applying a quasi-periodic phase shifting signal $I/V_\phi$ to the phase section of the semiconductor laser. The amplitude of the quasi-periodic signal transitions periodically between a maximum drive level and a minimum drive level at a frequency that varies randomly over time.

23 Claims, 4 Drawing Sheets

U.S. PATENT DOCUMENTS

| | | | |
|---|---|---|---|
| 6,738,398 B2 | 5/2004 | Hirata et al. | 372/32 |
| 6,816,525 B2 | 11/2004 | Stintz et al. | 372/45 |
| 7,010,006 B2 | 3/2006 | Kasazumi et al. | 372/29.02 |
| 7,154,923 B2 | 12/2006 | Kucharski | 372/29.015 |
| 7,257,142 B2 | 8/2007 | Sochava et al. | 372/50.1 |
| 2001/0005388 A1* | 6/2001 | Hirata et al. | 372/22 |
| 2002/0075918 A1 | 6/2002 | Crowder | 372/38.02 |
| 2002/0125406 A1 | 9/2002 | Roddy et al. | 250/205 |
| 2004/0086012 A1 | 5/2004 | Kitaoka et al. | 372/43 |
| 2004/0264525 A1 | 12/2004 | Senga et al. | 372/38.1 |
| 2005/0265419 A1* | 12/2005 | Fujii et al. | 372/96 |
| 2006/0159139 A1 | 7/2006 | Hu et al. | 372/26 |
| 2006/0193354 A1 | 8/2006 | Rosenblatt | 372/29.023 |
| 2006/0215716 A1 | 9/2006 | Luo et al. | 372/38.08 |
| 2006/0291510 A1 | 12/2006 | Juluri | 372/29.021 |

FOREIGN PATENT DOCUMENTS

| | | |
|---|---|---|
| GB | 2433644 A | 6/2007 |
| JP | 58025735 A | 2/1983 |
| WO | WO99/43060 | 8/1999 |
| WO | WO2008/048474 A1 | 4/2008 |

OTHER PUBLICATIONS

Y. Kitaoka, et al, "Wavelength stabilization of a distributed Bragg reflector laser diode by use of complementary current injection," Optics Letters/vol. 28, No. 11/Jun. 1, 2003.

Minora Yamada, et al, "Analysis of gain suppression in undoped injection lasers," J. Appl. Phys. 52(4) Apr. 1981.

Moustafa F. Ahmed, et al, "Influence of the Spectral Gain Suppression on the Intensities of Longitudinal Modes in 1.55 µm InGaAsP Lasers," Egypt. J. Sol. vol. 26, No. 2, 2003.

N. Nakamura, et al, "Longitudinal-mode behaviors of mode-stabilized $Al_xGa_{1-x}As$ injection lasers," J. Appl. Phys. 49(9), Sep. 1978.

Nagaatsu Ogasawara, et al, "Longitudinal Mode Competition and Asymmetric Gain Saturation in Semiconductor Injection Lasrs. II. Theory," Japanese Journal of Applied Physics, vol. 27, No. 4, Apr. 1988, pp. 615-626.

T. A. Heumier, et al, "Mode Hopping in Semiconductor Lasers," Application Note #8, ILX Lightwave Co. (Jan. 1992).

Hirolcazu Hora, et al, "Mode-transition characteristics and tenability of an AlGaAs laser," J. Appl. Phys. 60 (7), Oct. 1, 1986.

Daniel Chu, et al, "Optical Networks promote tunable laser development," LaserFocusWorld Aug. 2001.

J. S. Major, Jr., et al, "Singlemode InGaAs/GaAs distributed Bragg reflector laser diodes operating at 1083nm," Electronics Letters, Nov. 25, 1993, vol. 29, No. 24.

P. Eliseev, et al, "Tunable Grating-Coupled Lser Oscillation and Spectral Hole Burning in an InAs Quantum-Dot Laser Diode," IEEE Journal of Quantum Electronics, vol. 36, No. 4, Apr. 2000.

* cited by examiner

US 8,204,091 B2

WAVELENGTH NORMALIZATION IN PHASE SECTION OF SEMICONDUCTOR LASERS

BACKGROUND OF THE INVENTION

The present invention relates generally to semiconductor lasers, laser controllers, laser projection systems, and other optical systems incorporating semiconductor lasers. More particularly, some embodiments of the present invention relate to schemes for managing laser wavelength variations in semiconductor lasers. Other embodiments of the present invention relate to schemes for minimizing systematic wavelength variations in the output of a wavelength conversion device optically coupled to a semiconductor laser, and schemes for disrupting the temperature evolution signature within a scanned laser image of a laser projection system.

SUMMARY OF THE INVENTION

The present invention relates generally to semiconductor lasers, which may be configured in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, a vertical cavity surface-emitting laser (VCSEL), a vertical external cavity surface-emitting laser (VECSEL) or a Fabry-Perot laser with a light wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of a SHG crystal, which converts the wavelength to 530 nm. However, the wavelength conversion efficiency of an SHG crystal, such as MgO-doped periodically poled lithium niobate (PPLN), is strongly dependent on the wavelength matching between the laser diode and the SHG device. As will be appreciated by those familiar with laser design, DFB lasers are resonant-cavity lasers using grids or similar structures etched into the semiconductor material as a reflective medium. DBR lasers are lasers in which the etched grating is physically separated from the electronic pumping area of the semiconductor laser. SHG crystals use second harmonic generation properties of non-linear crystals to frequency double laser radiation.

The wavelength conversion efficiency of a wavelength converter such as an SHG strongly depends on the wavelength matching between the laser diode and the wavelength conversion device. The bandwidth of a PPLN SHG device is often very small—for a typical PPLN SHG wavelength conversion device, the full width half maximum (FWHM) wavelength conversion bandwidth is only in the 0.16 to 0.2 nm range and mostly depends on the length of the crystal. Mode hopping and uncontrolled large wavelength variations within the laser cavity can cause the output wavelength of a semiconductor laser to move outside of this allowable bandwidth during operation. Once the semiconductor laser wavelength deviates outside the wavelength conversion bandwidth of the PPLN SHG device, the output power of the conversion device at the target wavelength drops. In laser projection systems, for example, mode hops are particularly problematic because they can generate instantaneous changes in power that will be readily visible as defects at specific locations in the image. These visible defects typically manifest themselves as organized, patterned image defects across the image because the generated image is simply the signature of the temperature evolution of the different sections of the laser.

Given the challenges associated with wavelength matching and stabilization in developing semiconductor laser sources, the present inventors have recognized beneficial schemes for managing laser wavelength variations in semiconductor lasers. The present inventors have also recognized beneficial schemes for managing systematic wavelength variations in the output of a wavelength conversion device optically coupled to a semiconductor laser by disrupting the unfavorable temperature evolution signature of the laser.

The present inventors have recognized that although the concepts of the present invention are described primarily in the context of DBR lasers, it is contemplated that the control schemes discussed herein will also have utility in a variety of types of semiconductor lasers, including but not limited to DFB lasers, Fabry-Perot lasers, and many types of external cavity lasers. It is also noted that, particular embodiments of the present invention relate to wavelength stabilization in laser sources in general, without regard to whether second harmonic generation is utilized in the laser source.

According to one embodiment of the present invention, methods of controlling laser projection systems incorporating semiconductor lasers and laser controllers programmed to execute such methods are provided. More specifically, the method comprises generating at least a portion of a scanned laser image and applying a quasi-periodic phase shifting signal $I/V_\Phi$ to the phase section of the laser, wherein the amplitude of the quasi-periodic signal transitions periodically between a maximum drive level and a minimum drive level at a frequency that varies randomly over time.

According to another embodiment of the present invention, a method of controlling a laser projection system is provided, the method comprises generating at least a portion of a scanned laser image comprising image lines and frames, applying a drive signal $I_{GAIN}$ into the gain section of the semiconductor laser comprising a plurality of wavelength recovery portions and maintaining the wavelength of the output beam of the semiconductor laser approximately equal to a phase matching wavelength of the wavelength conversion device by the use of an external power feedback loop. The method further comprises shifting an optical emission of the semiconductor laser by applying a plurality of quasi-periodic phase shifting signals $I/V_\Phi$ to the phase section of the semiconductor laser, wherein the amplitude of the quasi-periodic signals transitions periodically between a maximum drive level and a minimum drive level independently of one another at a frequency that varies randomly over time.

Although the concepts of the present invention are described primarily in the context of image forming, it is contemplated that various concepts of the present invention may also be applicable to any laser application where repeatable, low frequency fluctuation of the laser wavelength is a problem.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
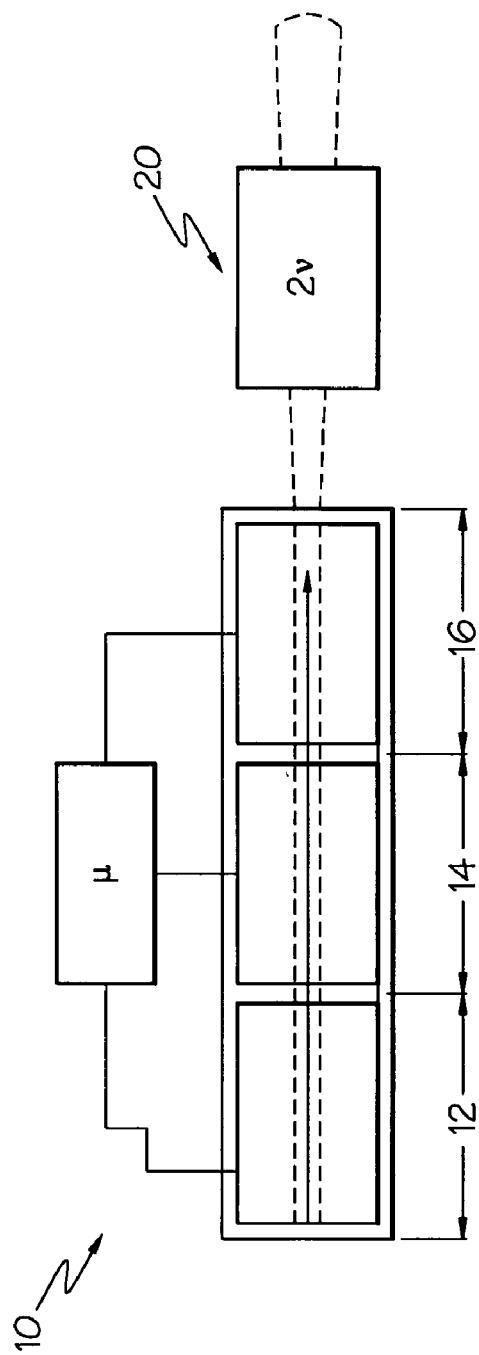
FIG. 1 is a schematic illustration of a DBR or similar type semiconductor laser optically coupled to a light wavelength conversion device.

Although the specific structure of the various types of semiconductor lasers in which the concepts of particular embodiments of the present invention can be incorporated is taught in readily available technical literature relating to the design and fabrication of semiconductor lasers, the concepts of particular embodiments of the present invention may be conveniently illustrated with general reference to a three-section DBR-type semiconductor laser 10 illustrated schematically in FIG. 1. In FIG. 1, the DBR laser 10 is optically coupled to a light wavelength conversion device 20. The light beam emitted by the semiconductor laser 10 can be either directly coupled into the waveguide of the wavelength conversion device 20 or can be coupled through collimating and focusing optics or some other type of suitable optical element or optical system. The wavelength conversion device 20 converts the incident light into higher harmonic waves and outputs the converted signal. This type of configuration is particularly useful in generating shorter wavelength laser beams from longer wavelength semiconductor lasers and can be used, for example, as a visible laser source for laser projection systems.

In the context of laser projection systems, a scanned laser image is generated by scanning an output beam of visible light across an image line that is made up of individual pixels. Each individual image line and pixel is characterized by a duration of $t_L$ and $t_P$, and an image line generation frequency and an image pixel generation frequency, respectively. A plurality of the image lines make up an image frame. These image frames, which have a duration $t_F$ and an image frame generation frequency, are then repeated at a desired frequency to create the scanned laser image that is observed by the viewer.

The DBR laser 10 illustrated schematically in FIG. 1 comprises a wavelength selective section 12, a phase section 14, and a gain section 16. The wavelength selective section 12, which may also be referred to as the DBR section of the laser 10, typically comprises a first order or second order Bragg grating positioned outside the active region of the laser cavity. This section provides wavelength selection, as the grating acts as a mirror whose reflection coefficient depends on the wavelength. The gain section 16 of the DBR laser 10 provides the major optical gain of the laser and the phase section 14 creates an adjustable phase shift between the gain material of the gain section 16 and the reflective material of the wavelength selective section 12. Both the gain section 16 and the wavelength selective section 12 are functions of the desired output modulation pattern (e.g., a video signal in a laser projection device).

As with the wavelength selective section 12, the phase section is passive in the sense that it does not provide gain to the laser 10. The effect of injecting a signal into the phase section 14 is to shift the wavelength of the laser cavity modes. A signal that is injected into the phase section 14 may be independent of the signals injected into the gain section 16 and wavelength selective section 12, and may aid in achieving modulation consistency and therefore increased projected image quality in a laser projection device. The wavelength selective section 12 may be provided in a number of suitable alternative configurations that may or may not employ a Bragg grating.

A laser microcontroller t controls electrical currents that are injected into corresponding sections 12, 14 and 16 of the laser 10. The injected current can be used to alter the operating properties of the laser by, for example, controlling the temperature of one or more of the laser sections, injecting electrical current into a conductively doped semiconductor region defined in the laser substrate, controlling the index of refraction of the wavelength selective and phase sections 12, 14 of the laser 10, controlling optical gain in the gain section 16 of the laser, etc. The wavelength selective and phase sections 12, 14 may be addressed by injecting current into the respective semiconductor junction, by applying a reverse voltage into the junction or by using heaters located at the proximity of the waveguide.

The wavelength conversion efficiency of the wavelength conversion device 20 illustrated in FIG. 1 is dependent on the wavelength matching between the semiconductor laser 10 and the wavelength conversion device 20. The output power of the higher harmonic light wave generated in the wavelength conversion device 20, such as an SHG crystal, drops drastically when the output wavelength of the laser 10 deviates from the wavelength conversion bandwidth of the wavelength conversion device 20. For example, when a semiconductor laser is modulated to produce data, the thermal load varies constantly. The resulting change in laser temperature and lasing wavelength generates a variation of the efficiency of the SHG crystal 20. In the case of a wavelength conversion device 20 in the form of a 12 mm-long PPLN SHG device, a temperature change in the semiconductor laser 10 of about 2° C. will typically be enough to take the output wavelength of the laser 10 outside of the 0.16 nm full width half maximum (FWHM) wavelength conversion bandwidth of the wavelength conversion device 20. When modulating the laser to produce a useful signal, the laser is submitted to fast thermal load variations which create fast wavelength fluctuations. Particular embodiments of the present invention address this problem by limiting laser wavelength variations to acceptable levels.

Figure 3:
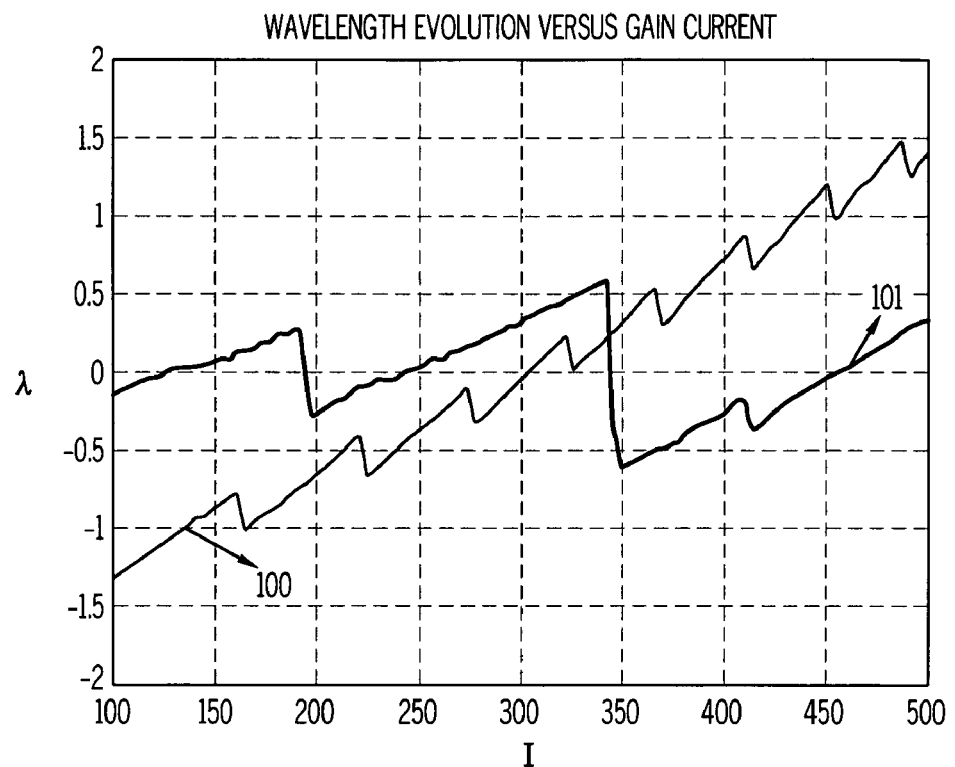
FIGS. 3 and 4 illustrate the evolution of emission wavelength as a function of gain current in a DBR laser.

The present inventors have recognized challenges in stabilizing the emission wavelength of a semiconductor laser 10 because they are commonly subject to wavelength drift and associated cavity mode hopping. For example, and not by way of limitation, FIG. 3 illustrates the evolution of emission wavelength as a function of gain current in a DBR laser. When the gain current increases, the temperature of the gain section 16 also increases. For example, as current is injected into the gain section 16, the active and cladding regains of the gain section 16 may be heated, which leads to an increase of the refractive index of the gain section 16 and also an increase of the optical path length. As a consequence, the cavity modes move towards higher wavelengths. The temperature of the DBR section 12 also rises, creating gain-DBR thermal crosstalk which increases the Bragg and lasing wavelengths to longer wavelengths. The wavelength of the cavity modes move faster than the wavelength of the DBR section. So, the laser reaches a point where a cavity mode of lower wavelength is closer to the maximum of the DBR reflectivity curve. At that point, the mode of lower wavelength has lower loss than the mode that is established and, according to basic principles of laser physics, the laser then automatically jumps to the mode that has lower loss. This behavior is illustrated on the curve 100 of FIG. 3. As is illustrated in FIG. 3, the wavelength slowly increases and includes sudden mode hops whose amplitude is equal to one free spectral range of the laser cavity.

To maintain a nominal phase matching condition between the semiconductor laser 10 and the wavelength conversion frequency of the wavelength conversion device 20, any number of common control schemes may be utilized. By way of example and not limitation, a feedback loop control system, such as the feedback control systems disclosed in GB 2,433, 644 and U.S. Pat. No. 6,323,990, for example, may be used to maintain the output wavelength of the laser 10 at approximately equal to the phase matching wavelength of the wavelength conversion device 20. More specifically, temperature sensors affixed on the semiconductor laser 10 and wavelength conversion device 20 may be used in conjunction with a feedback loop control system to monitor and control the temperature of the laser 10. Similarly, a beam splitter and detector may also be used in conjunction with a feedback loop control system to monitor and control the output power and wavelength of the semiconductor laser 10. However, even with these various control schemes, there are still smaller (0.03 to 0.12 nm) changes in the native wavelength which will occur during the modulation associated with image projection. These small wavelength variations are typically repeatable and thus can be visually observed as undesirable, but repeatable intensity fluctuations.

Although the present invention is not limited to any particular manifestation of the wavelength variations and sudden mode hops, in the context of a laser projection system, these wavelength fluctuations can create smooth intensity variations and the mode hops can create relatively abrupt intensity shifts in the image created by scanning the laser. The particular pattern created in the image by these defects can be a function of a number of factors including, but not limited to, laser temperature, laser free spectral range, the PPLN crystal spectral band pass, the spectral alignment of the laser DBR with respect to the PPLN crystal, etc. Regardless of the nature of the defect pattern, the pattern itself can present a problem in the image because it presents a readily recognizable, systematic structure in the image.

As is described in detail below, image defects of this nature can be made harder to detect by applying a phase shifting signal to the phase section 14 of the semiconductor laser. For example, and not by way of limitation, if the phase signal is randomly altered, the consequence will be that some pixels, lines or frames will have a defect pattern, but the nature of the pattern, i.e., the position of the dark and bright areas in the pattern, will change randomly such that the eye will integrate in time all the images so that it will be hard to detect any systematic defect. As a consequence, the organized systematic image defect is disrupted, which makes any image defect much more difficult for the human eye to recognize.

Referring further to FIG. 3, curve 101 illustrates significantly different emission behavior in a DBR laser. Specifically, a laser having the same general manufacturing parameters as the laser illustrated with reference to curve 100, may exhibit significantly different behavior in the sense that, instead of having mode hops with an amplitude of one laser free spectral range, the laser will exhibit mode hops having up to 6 or more free spectral range amplitudes. For many applications, this large sudden wavelength variation would not be acceptable. For example, in the case of a laser projection system, these large hops would cause sudden intensity jumps in the image from a nominal grey-scale value to a value close to zero. The present inventors have investigated this phenomena, as well as wavelength instability and hysteresis in lasers, and note that these laser emission defects can be attributed to one or more of a variety of factors, including spatial hole burning, spectral hole burning, gain profile broadening, and self induced Bragg gratings. It is contemplated that these factors may lock lasing on the particular cavity mode that has been established in the laser cavity or encourage larger mode hops. Indeed, it appears that once a mode is established, the photons that are inside the cavity at a specific wavelength disturb the laser itself by depleting the carrier density at a specific energy level or by creating a self induced Bragg grating in the cavity.

Figure 4:
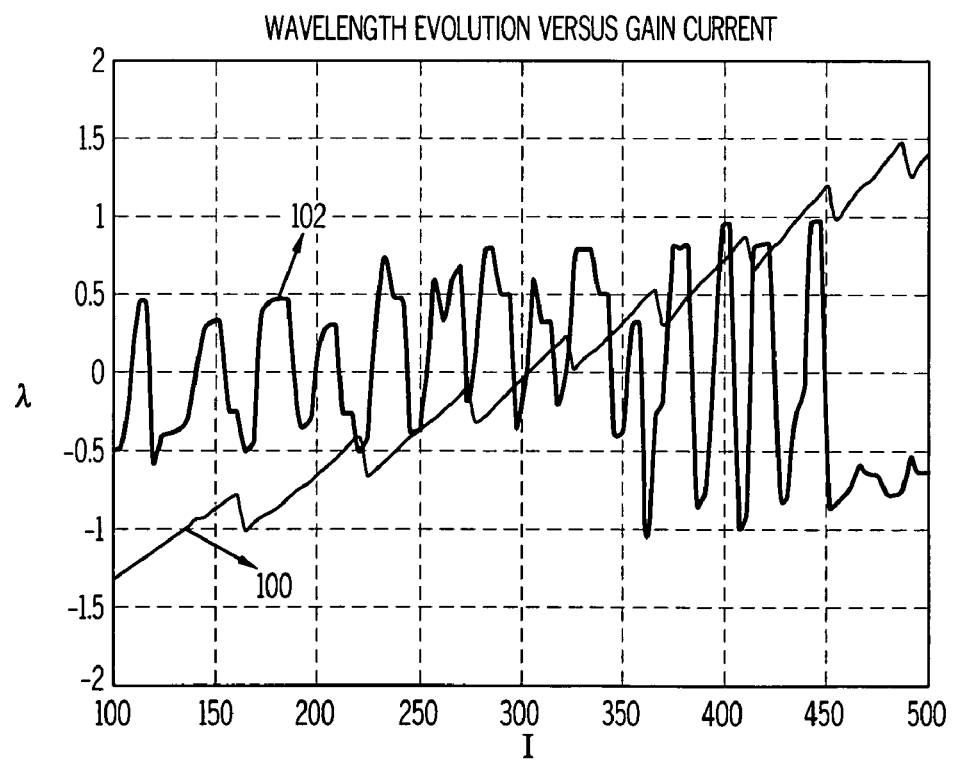

The curve 102 of FIG. 4 illustrates another case of special mode hopping behavior. In the illustrated case, the emission wavelength is unstable because it includes back reflections attributable to a component located outside the laser, a phenomena referred to as the external cavity effect. With the external cavity effect, an external reflection creates a parasitic Fabry-Perot cavity that disturbs the laser cavity and is capable of generating mode hops of very large amplitude. Regardless of the source of unacceptable wavelength drift in a semiconductor laser, particular embodiments of the present invention are directed at managing wavelength fluctuations of the laser.

The present inventors have recognized that the large wavelength fluctuations and associated mode-hopping effect illustrated in FIGS. 3 and 4 is at least partially dependent upon photon density in the laser cavity and can be amplified when having significant external cavity effects. The present inventors have also recognized that the lasing wavelength may jump more than one mode and that this multi-mode jump may be attributable, in whole or in part, to spectral and spatial hole burning and additional lasing phenomena such as external cavity effects.

Regardless of the cause of multi-mode drift in semiconductor lasers, when this phenomenon occurs, the lasing wavelength usually shows abnormal wavelength jumps which are equal to a multiple of the cavity mode spacing. Before a large mode hop occurs, the laser usually shows large continuous wavelength shift. The larger wavelength drift and the abnormal wavelength jump can cause unacceptable noise in a laser signal. For example, if this phenomenon happens systematically in a laser projection system, an example of which is illustrated schematically in FIG. 2, the noise in the projected image will be readily visible to the human eye.

The present inventors have recognized that semiconductor lasers commonly exhibit a temperature evolution signature that can create unfavorable patterning in the output of the laser and the output of a wavelength conversion device coupled to the laser. This unfavorable patterning can create significant problems in the context of the laser projection systems described above. If not compensated, the thermally-induced wavelength changes result in power fluctuations that cause patterning in the output of the higher harmonic light wave. Accordingly, the present invention also contemplates phase altering scheme for disrupting the temperature evolution signature of a semiconductor laser or otherwise controlling lasing wavelength of a semiconductor laser.

Figure 5:
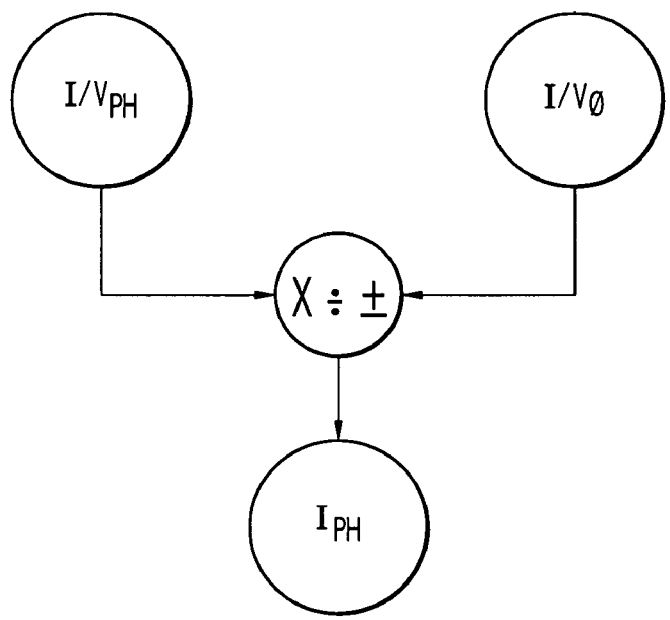
FIG. 5 illustrates a scheme for disrupting the unfavorable temperature evolution signature of a semiconductor laser.

Referring initially to FIGS. 1 and 5, it is noted that one embodiment of the present invention utilizes a laser controller that comprises a phase control mechanism that provides a quasi-periodic phase shifting signal $I/V_\Phi$ to modify the drive signal $I/V_{PHASE}$ that is used to control the phase section 14 of a semiconductor laser 10 comprising, for example, a wavelength selective section 12, a phase section 14, and a gain section 16. As illustrated in FIG. 5, the modification of the drive signal $I/V_{PHASE}$ can be executed using multiplication, division, summation, or combinations thereof, but it is contemplated that any suitable algorithm or modification process may be used in conjunction with the phase shifting signal $I/V_\Phi$. Many different control methods may be utilized to change the refractive index of the phase section 14. For example, the phase shifting signal $I/V_\Phi$ and the drive signal $I/V_{PHASE}$ may be voltage or current-based control signals, depending on the structure of the semiconductor laser. The signals may be applied to the phase section 14 of a semiconductor laser 10 by thermal effect via the use of microheaters in thermal communication with the phase section 14, by carrier effect via direct electrical current or voltage injection into the phase section 14, or by an electro-optical effect in which voltage applied to electrodes in the phase section 14 creates an electric field so as to vary the index of refraction of the non-linear electro-optical material of the phase section 14.

Figure 6:
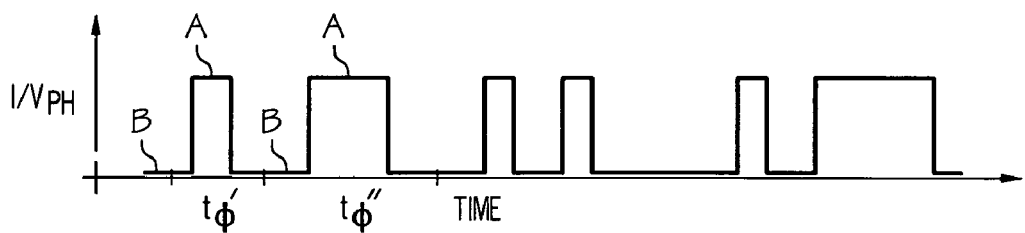
FIG. 6 illustrates an example of a phase shifting signal profile for use in the scheme illustrated in FIG. 5.
Figure 7:
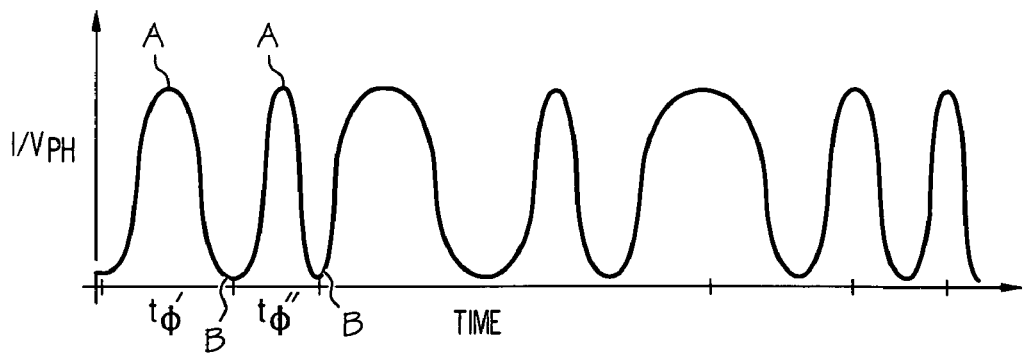
FIG. 7 illustrates an example of a phase shifting signal profile for use in the scheme illustrated in FIG. 5.

Generally, the quasi-periodic phase shifting signal $I/V_\Phi$ is selected to disrupt systematic wavelength variations in the optical emission of the semiconductor laser. More specifically, the quasi-periodic signal is a signal that transitions between a distinct maximum drive level and a distinct minimum drive level. As illustrated in FIGS. 6 and 7, the modulation frequency of the phase shifting signal $I/V_\Phi$ may be randomly varied. The duration of the periods of a transition from a minimum drive level to a maximum drive level and back to the minimum drive level varies randomly over time. Therefore, the periods within the quasi-periodic phase shifting signal $I/V_\Phi$ occur irregularly throughout the signal. The change in frequency may occur within a given frequency range. For example, the periods $t_\Phi'$ and $t_\Phi''$ of the phase shifting signal $I/V_\Phi$ may be varied between the range of 10 ns to 200 ns, thereby varying the frequency of the quasi-periodic signal between 5 MHz and 100 MHz. By adding a frequency modulated signal with randomly varying frequency to the thermal drift of the cavity modes, the mode selection gets modified in a random manner.

The effect of applying the phase shifting signal $I/V_\Phi$ in a laser projection system is to perturb the lasing wavelength of the semiconductor laser 10 randomly and independent of the gain current modulation, and thereby disrupt the normal patterning effect intrinsic to the laser module. For example, in a laser projection system, by disrupting the normal patterning effect, the repeated patterns are not detectable by the human eye, thus improving the quality of the image generated.

FIG. 6 illustrates an exemplary quasi-periodic phase shifting signal $I/V_\Phi$ as a frequency modulated square wave with a randomly varying frequency. The amplitude profile of the phase shifting signal $I/V_\Phi$ comprises a plurality of mode shifting segments A and basal phase control segments B. The amplitude of the mode shifting segments A is greater than the amplitude of the basal phase control segments B and is configured such that the mode shifting segments A shifts the cavity modes of the laser. The amplitude of the mode shifting segments A may be of any appropriate amplitude that may shift the cavity modes. Conversely, the amplitude of the basal phase control signal B is configured such that the cavity modes are maintained in a natural state, or are shifted back to a natural state following a mode shifting segment A.

FIG. 7 illustrates an exemplary phase shifting signal $I/V_\Phi$ as a frequency modulated sine wave with randomly varying frequency. The high amplitude portions of the sine wave may be mode shifting segments A that are of an amplitude that the mode shifting segments A shift the cavity modes of the laser. The low amplitudes of the signal may comprise basal mode shifting segments B that are of an amplitude such that the cavity modes are maintained in a natural state, or are shifted back to a natural state following a mode shifting segment A.

Although FIGS. 6 and 7 illustrate basal phase control segments B having either zero voltage or zero current, the amplitude of the basal phase control segment B may be any amplitude that places the cavity modes in an unshifted state. The amplitudes of the mode shifting segment A and the basal phase control segment B result in an average desired current or voltage to be driven into the phase section 14 of the laser 10.

Configuring the phase shifting signal $I/V_\Phi$ with one relatively high drive level and one relatively low drive level such as the mode shifting segment A and basal control segment B, as opposed to an analog signal with many various levels, allows the systematic patterns to be disrupted in a simple and low cost manner. Unlike analog linear circuits that require complex digital to analog converters (DAC) or other similar circuits, a phase shifting signal $I/V_\Phi$ comprising two distinct drive levels may be created by utilizing a simple, low cost circuit to drive the phase section 14 of the laser 10. Additionally, because the resulting phase control mechanism circuit may operate in a switched ON-OFF mode as opposed to a linear mode, high electronic efficiency and speeds may be achieved without additional complex circuitry. The switching circuit providing the shifting signal $I/V_\Phi$ may be required to adjust the phase section within a few tens of nanoseconds, which may not be practical for a DAC.

By varying the average time density of the maximum level drive signal versus the minimum level drive signal, the power consumption of the phase control mechanism and therefore the laser 10 may be optimized. The power required by the laser 10 is related to the magnitude of the current driven into the phase section 14. Accordingly, by adjusting the distribution of the two drive levels while ensuring a maximum time between transitions, such that the time average current level is minimized, the phase control power consumption may be minimized. By optimizing and minimizing the power consumption of the phase control mechanism, the temperature rise of the laser may also be reduced.

Particular embodiments may incorporate multiple quasi-periodic phase shifting signals $I/V_\Phi$ into the phase section 14 of the semiconductor laser. For example, multiple phase shifting signals $I/V_\Phi$ having a frequency that randomly varies in time independently of the other signals may be summed to achieve more distinct drive levels. Each of the phase shifting signals $I/V_\Phi$ may have a different amplitude profile such that signals of differing amplitudes are injected into the phase section 14. For example, summing between two and four independent phase shifting signals $I/V_\Phi$ may allow for image quality enhancement while maintaining the key cost and power consumption benefits.

Figure 8:
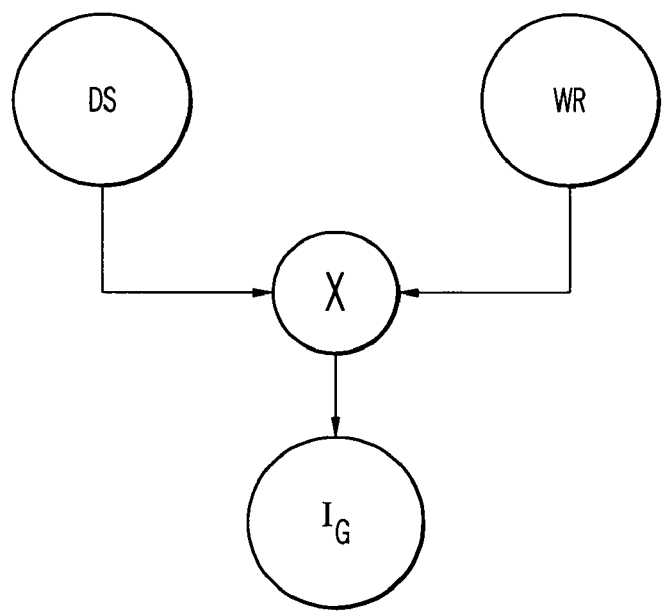
FIG. 8 illustrates a scheme for controlling laser wavelength according to one embodiment of the present invention.
Figure 9:
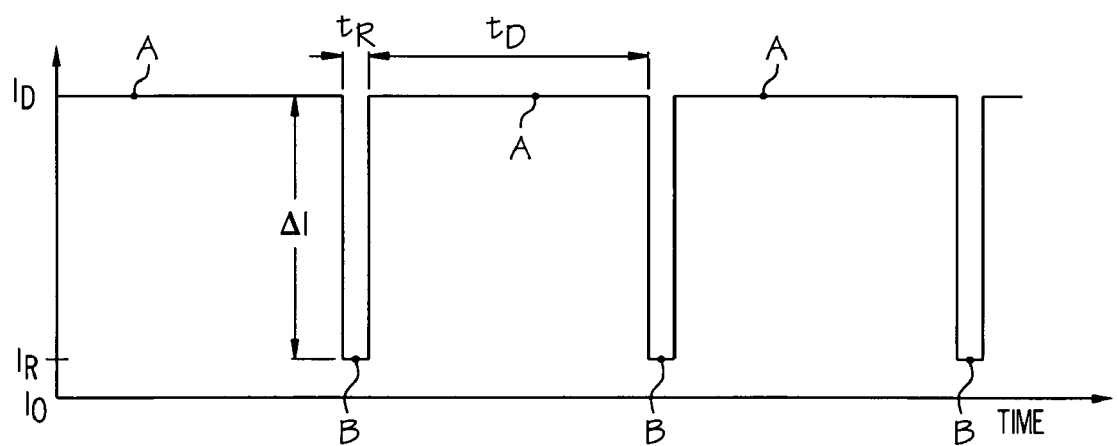
FIG. 9 is an illustration of the control scheme illustrated in FIG. 8.

Particular embodiments of the present invention may also incorporate a control scheme where a semiconductor laser drive current, such as $I_G$ or $I_{DBR}$ for example, comprises a drive portion and a wavelength recovery portion that may be applied to the wavelength selective section 12 or the gain section 16. FIGS. 8 and 9 illustrate a scheme for controlling wavelength in a single mode laser signal where the drive portion comprises a data portion that is injected as electrical current into the gain section 14 or the DBR section 12 of the semiconductor laser. Accordingly, in the illustrated embodiment, the drive current comprises respective data portions A and wavelength recovery portions B. Referring specifically to FIG. 8, theses portions of the drive current or gain injection current can be introduced by taking the product of a laser data signal and a suitably configured wavelength recovery signal. For example, and not by way of limitation, the laser data signal may carry image data for projection in a laser projection system. As is illustrated in FIG. 9, the wavelength recovery signal is configured such that the data portion of the gain section drive current, i.e., the gain injection current, comprises a relatively high drive amplitude $I_D$ of relatively long drive duration $t_D$, while the wavelength recovery portion of the drive current comprises a relatively low recovery amplitude $I_R$ of relatively short recovery duration $t_R$. The relatively high drive amplitude $I_D$ of the data portion is sufficient for lasing within the laser cavity at a lasing mode $\lambda_0$. The relatively low recovery amplitude $I_R$ of the wavelength recovery portion of the drive current is distinct from the drive amplitude $I_D$ and is illustrated in FIG. 9 as being $\Delta I$ lower than the drive amplitude $I_D$. The relatively low recovery amplitude $I_R$ may be zero, or a value close to or less than a laser threshold value that will reset the laser.

The drive amplitude $I_D$ and duration $t_D$ of the data portion of the gain section drive current act to produce the optical signal with appropriate power and wavelength, depending of course on the specific application in which it is to be used. The recovery amplitude $I_R$ and the recovery duration $t_R$ are sufficient to decrease photon density within at least a portion of the laser cavity. By decreasing the photon density to a lower value, in many cases close to zero, the various phenomena that cause large wavelength drift, such as spectral hole burning, spatial hole burning, gain profile broadening, or self induced Bragg gratings, disappear. As a consequence, when significant current is re-injected into the gain section at the end of the recovery period, the laser automatically selects the modes that are among the closest to the maximum of the DBR reflectivity curve. Therefore, the wavelength fluctuations can be limited to one laser free spectral range and the multi-cavity mode hops are eliminated, or at least significantly reduced. The resulting gain section drive current, which comprises the data portion and the wavelength recovery portion can be used to minimize wavelength drift and narrow the time-average laser oscillation optical bandwidth of the laser.

Stated differently, the drive amplitude $I_D$ and duration $t_D$ of the data portion of the gain section drive current increase the probability that the lasing wavelength will undergo an unacceptable drift, for example, and not by way of limitation, a change in wavelength that exceeds 0.05 nm. The relatively low recovery amplitude $I_R$ of the density recovery portion of the gain section drive current follows the data portion of the drive current and decreases the probability of an unacceptable wavelength drift. If the recovery portion of the drive current has a sufficient high frequency of occurrence, a lasing cavity mode is shut off before it has accumulated large wavelength drift and a new cavity mode is selected, therefore reducing the large wavelength drift.

In the context of a laser projection system including, for example, a frequency doubled PPLN green laser, without wavelength control according to embodiments of the present invention, the green power emitted by the laser over a single line of the image display will exhibit sudden variations in power due to multiple cavity mode hops. As a result, projected images will have abrupt drops in power with amplitude on the order of 50% and more. However, employing wavelength control schemes according to particular embodiments of the present invention where the drive signal is altered for every pixel, e.g., typically every 40 ns, it is contemplated that the undesired decrease in laser power will be highly mitigated. For example, in one execution of an embodiment of the present invention, residual noise standard deviation in the image was on the order of 8% with the recovery amplitude $I_R$ set to near zero, the recovery duration $t_R$ at about 10 ns, and the drive duration $t_D$ at about 40 ns. The image was also observed to have defects with relatively high spatial frequency, which are typically not readily apparent to the naked eye.

Although the recovery amplitude $I_R$ may be zero, it can be any value that is sufficient to eliminate the source of multiple cavity mode hops or otherwise improve the wavelength behavior of the laser. The recovery amplitude $I_R$ of the gain section drive current will be lower than the drive amplitude $I_D$ and can be substantially above zero. The relatively high drive amplitude $I_D$ may be substantially continuous but will often vary in intensity, particularly where the semiconductor laser is incorporated in an image projection system, as is described in further detail below.

Where the laser is configured for optical emission of encoded data, a data signal representing the encoded data is applied to the laser. For example, and not by way of limitation, the data signal may incorporated as an intensity or pulse-width modulated data portion of a drive signal injected into the gain section of the laser. The wavelength recovery operation of particular embodiments of the present invention is executed to be at least partially independent of the data encoded in the data signal. For example, where the drive current is injected into the gain section of the laser, its drive portion may be intensity modulated to encode data. The wavelength recovery portion of the drive current is superimposed on the drive current, independent of the encoded data. Similarly, where the drive portion is pulse-width modulated to encode data, the wavelength recovery portion of the drive current will also be superimposed on the drive current.

The aforementioned superposition may be completely independent of the encoded data or may be applied only where the intensity of the drive current or the duration of the pulse width representing the encoded data reaches a threshold value, in which case it would be partially dependent on the encoded data. Once superimposed, however, the extent of independence of the wavelength recovery portion would need to be sufficient to ensure that sufficient wavelength recovery would be obtained. Stated differently, the wavelength recovery portion of the drive current should dominate the drive current under conditions where the data signal would otherwise prevent wavelength recovery. For example, in the context of a pulse-width modulated data signal, it is contemplated that wavelength recovery may not be needed for relatively short, high amplitude pulse-widths. However, where the encoded data includes relatively long, high amplitude pulse widths, the duty cycle defined by the drive operation and wavelength recovery operation should be sufficient to limit the maximum duration of the high amplitude pulse width to ensure that wavelength recovery can be achieved before unacceptable wavelength drift is observed. For example, it may be preferable to ensure that the maximum duration of the pulse width cannot exceed about 90% of the duration of the duty cycle defined by the drive operation and wavelength recovery operation. In addition, in the context of pulse-width modulated data, care should also be taken to ensure that the recovery amplitude $I_R$ of the wavelength recovery portion is below the threshold lasing current of the semiconductor laser or sufficiently low to recover the wavelength.

It is also noted that the wavelength recovery signal does not need to be implemented on a regular, periodic basis. Rather, the recovery signal can be applied as-needed. For example, if a wavelength drift exceeding an acceptable value is detected, e.g., more than one cavity mode spacing, a wavelength recovery operation can be implemented by superimposing a wavelength recovery signal on the drive current, forcing the laser to choose a new wavelength.

In terms of frequency of the recovery period, it generally needs to be frequent enough to limit the wavelength variation between two recovery periods to an acceptable amplitude. The ideal frequency and approach depends on the particular demands associated with the application in which the laser is utilized. Also, by performing recovery at the highest possible frequency compatible with the electronics and laser speed any noise in the image will occur at a higher spatial frequency, making the noise harder to detect.

As an example, for laser projection, it may be preferable to initiate recovery periods randomly or synchronize recovery periods with the image pixel generation to avoid any aliasing problem between the data content, i.e., the image, and the recovery signal. Initiating the recovery periods randomly will prevent periodic image defects from occurring line to line by ensuring that the recovery period does not occur at the same location in each image line.

Figure 2:
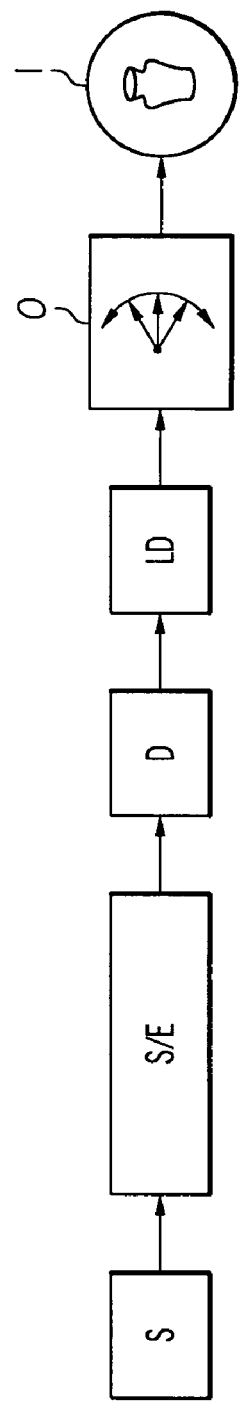
FIG. 2 is a schematic illustration of a laser projection system according to one embodiment of the present invention.

Referring to the laser projection system illustrated schematically in FIG. 2, it is noted that the drive current control schemes according to particular embodiments of the present invention may be executed in a variety of forms within the system. For example, and not by way of limitation, the wavelength recovery portion of the drive current may be executed by integrating the recovery portion into the video signal during rendering by the projection software and electronics. In this approach pixels distributed throughout the image would be altered by the wavelength recovery signal independent of the required intensity from the source image. The frequency of this interruption should be chosen to minimize the impact on the human eye, and on perceived optical power. Alternatively, the wavelength recovery portion of the drive signal may be integrated into the laser driver electronics. In this approach, the drive signal, which is derived from the image stream, would be periodically overridden by the wavelength recovery signal prior to current scaling. Again, the frequency and duty cycle of this interruption should be chosen to minimize the impact on the human eye, and on perceived optical power. As a further alternative, the drive current to the laser could be periodically shunted, or otherwise reduced, to reduce or modify the drive current independent of the desired intensity level.

It is contemplated that FIGS. 8 and 9 illustrate a laser operation scheme that may be used to reduce noise in a single mode laser signal. Further, the scheme of FIGS. 8 and 9 may be used in systems incorporating one or more single mode lasers. For example, as is described in further detail below, it is contemplated that the scheme of FIGS. 8 and 9 may be used in a scanning laser image projection systems incorporating one or more single mode lasers. It is also noted that reference herein to single mode lasers or lasers configured for single mode optical emission should not be taken to restrict the scope of the present invention to lasers that operate in a single mode exclusively. Rather, the references herein to single mode lasers or lasers configured for single mode optical emission should merely be taken to imply that lasers contemplated according to particular embodiments of the present invention will be characterized by an output spectrum where a single mode of broad or narrow bandwidth is discernable therein or by an output spectrum that is amenable to discrimination of a single mode there from through suitable filtering or other means.

It is contemplated that the relative magnitudes of the drive duration $t_D$ and the recovery duration $t_R$ should be controlled to preserve an optimal degree of laser efficiency while ensuring adequate wavelength recovery. For example, according to one aspect of the present invention, at least about 80% of a duty cycle of the drive signal is occupied by the drive duration $t_D$ and less than about 20% of a duty cycle of the drive signal is occupied by the recovery duration $t_R$. In many instances, it will be sufficient to ensure that the recovery duration $t_R$ is less than about 10 ns, perhaps shorter than about 5 ns. Additionally control schemes are contemplated where at least about 95% of the duty cycle of the drive signal is occupied by the drive duration $t_D$ and less than about 5% of the duty cycle is occupied by the recovery duration $t_R$. In cases where the electric circuitry controlling the drive signal is sufficiently responsive, adequate control schemes are contemplated where at least about 97.5% of the duty cycle of the drive signal is occupied by the drive duration $t_D$ and less than about 2.5% of the duty cycle is occupied by the recovery duration $t_R$.

Additional considerations need to be accounted for when establishing the respective values of the drive duration $t_D$ the recovery duration $t_R$ in the context of laser projection systems. For example, and not by way of limitation, the laser projection system illustrated in FIG. 2 comprises an image source S generating a single or multi-color image data stream, image projection software and associated electronics S/E for generating a laser drive signal D for each primary image color, a laser driver LD generating respective laser drive currents for individual lasers configured to generate each primary image color, and scanning and projection optics O that operate to generate a single or multi-color projected image I comprising an array of image pixels. Each of the image pixels in this and other types of scanning laser image projecting systems is characterized by an active pixel duration $t_P$. For example, and not by way of limitation, the active pixel duration of a pixel in the image may be 40 ns or less. Generally, the recovery duration $t_R$ will be less than the pixel duration $t_P$. Preferably, the recovery duration $t_R$ is at least 50% less than the pixel duration $t_P$. In contrast, the drive duration $t_D$ may be greater than, less than, or equal to the pixel duration $t_P$, depending upon the preferences of the system designer.

Those skilled in the art will recognize that the active pixel duration $t_P$ may vary modestly and periodically across the image as a result of scanning speed variations. Accordingly, reference to a projecting system that is "characterized by an active pixel duration" should not be taken to denote that each pixel in an image has the same pixel duration. Rather, it is contemplated that individual pixels within the display may have different pixel durations that each fall under the general concept of a display characterized by an active pixel duration $t_P$.

A multi-tone image can be generated by the image projection system by configuring the image projection electronics and the corresponding laser drive currents to establish a pixel intensity that varies across the array of image pixels. In this case, the wavelength recovery portion of the drive current is superimposed upon the signal that encodes the varying pixel intensity. Further detail concerning the configuration of scanning laser image projection systems and the manner in which varying pixel intensities are generated across an image is beyond the scope of the present invention and may be gleaned from a variety of readily available teachings on the subject.

Although the present invention has been described with primary reference to pixel-based scanning projection systems, it is contemplated that other non-scanning projection systems, such as spatial light modulator based systems (including digital light processing (DLP), transmissive LCD, and liquid crystal on silicon (LCOS)), incorporating laser-based light sources may benefit from the wavelength stabilization and perturbation techniques described herein. Utilizing the phase shifting signal $I/V_\Phi$ in these non-scanning systems may enhance power stability and repeatability within the system. In these other systems the relevant period exogenous to the laser is not the pixel period but the inverse of the screen refresh rate, or a fraction thereof. In these cases the input signal to the laser will be characterized by an encoded data period $t_P$ and the drive current will be configured such that the recovery duration $t_R$ of the wavelength recovery portion is less than the encoded data period $t_P$.

Reference is made throughout the present application to various types of currents. For the purposes of describing and defining the present invention, it is noted that such currents refer to electrical currents. Further, for the purposes of defining and describing the present invention, it is noted that reference herein to "control" of an electrical current does not necessarily imply that the current is actively controlled or controlled as a function of any reference value. Rather, it is contemplated that an electrical current could be controlled by merely establishing the magnitude of the current.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For example, although the control schemes described herein relate to the incorporation of a wavelength recovery portion in a drive current applied to a gain section or wavelength selective DBR section of a semiconductor laser, it is contemplated that methods of incorporating the wavelength recovery operation in a laser operating scheme are not limited to drive currents applied to only these portions of a laser. For example, and not by way of limitation, the laser may include a recovery portion that is configured to absorb photons when a recovery signal is applied thereto. In which case, the recovery portion can be used to decrease photon density as needed, in a manner similar that which is employed for the gain and DBR sections described herein.

It is noted that terms like "preferably" and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation, e.g., "substantially above zero," varies from a stated reference, e.g., "zero," and should be interpreted to require that the quantitative representation varies from the stated reference by a readily discernable amount.

What is claimed is:

1. A method of controlling a laser projection system comprising a visible light source, wherein the visible light source comprises a semiconductor laser and a wavelength conversion device, the method comprises:
generating at least a portion of a scanned laser image by configuring the semiconductor laser for optical emission of encoded image data and scanning an output beam of the visible light source across a plurality of image pixels or encoded data periods, the semiconductor laser comprising a gain section, a phase section, and a wavelength selective section; and
shifting the optical emission across a plurality of laser cavity modes by applying a quasi-periodic phase shifting signal $I/V_\Phi$ to the phase section of the semiconductor laser, the quasi-periodic phase shifting signal $I/V_\Phi$ having only two distinct drive levels, a maximum drive level and a minimum drive level, wherein the quasi-periodic signal transitions periodically between the maximum drive level and the minimum drive level at a frequency that varies randomly over time independently of a drive signal $I_{GAIN}$ applied to the gain section of the semiconductor laser.

2. The method as claimed in claim 1 wherein the frequency of the phase shifting signal $I/V_\Phi$ varies randomly between an upper bound of approximately 100 MHz and lower bound of approximately 5 MHz.

3. The method as claimed in claim 1 wherein the phase shifting signal $I/V_\Phi$ is configured as a frequency modulated square wave.

4. The method as claimed in claim 1 wherein the phase shifting signal $I/V_\Phi$ is configured as a frequency modulated sine wave.

5. The method as claimed in claim 1 wherein the phase shifting signal $I/V_\Phi$ comprises a current signal and is applied to the phase section to alter carrier density in the phase section.

6. The method as claimed in claim 1 wherein the phase shifting signal $I/V_\Phi$ comprises a voltage signal and is applied to the phase section to alter carrier density in the phase section.

7. The method as claimed in claim 1 wherein the phase shifting signal $I/V_\Phi$ is applied to alter the optical properties of the phase section via an electro-optical effect.

8. The method as claimed in claim 1 wherein the phase shifting signal $I/V_\Phi$ is applied to alter the optical properties of the phase section via a thermal effect.

9. The method as claimed in claim 1 wherein the drive signal $I_{GAIN}$ comprises a plurality of data portions and corresponding wavelength recovery portions interposed temporally between corresponding data portions, wherein the data portions comprise respective drive amplitudes $I_D$ and drive durations $t_D$, and the wavelength recovery portions comprise recovery amplitudes $I_R$ distinct from the drive amplitudes $I_D$ of the data portions and recovery durations $t_R$ less than the drive durations $t_D$ of the data portion.

10. The method as claimed in claim 1 wherein the method further comprises applying a drive signal $I_{DBR}$ into the wavelength selective section of the semiconductor laser, the drive signal $I_{DBR}$ comprising a plurality of data portions and corresponding wavelength recovery portions interposed temporally between corresponding data portions, wherein the data portions comprise respective drive amplitudes $I_D$ and drive durations $t_D$, and the wavelength recovery portions comprise recovery amplitudes $I_R$ distinct from the drive amplitudes $I_D$ of the data portions and recovery durations $t_R$ less than the drive durations $t_D$ of the data portion.

11. The method as claimed in claim 1 wherein the phase shifting signal $I/V_\Phi$ is applied to the phase section such that it alternates between a mode shifting segment and a basal phase control segment, the mode shifting segment and the basal phase control segment each having a respective amplitude.

12. The method as claimed in claim 11 wherein the amplitude of the mode shifting segment is greater than the amplitude of the basal phase control segment.

13. The method as claimed in claim 11 wherein the respective amplitudes of the mode shifting segment and the basal phase control segment are selected to alter mode selection of the semiconductor laser when the phase shifting signal $I/V_\Phi$ transitions between the mode shifting segment and the basal phase control segment.

14. The method as claimed in claim 1 wherein:
a drive signal $I/V_{PHASE}$ is applied to the phase section of the semiconductor laser to control the wavelength of the plurality of laser cavity modes; and the drive signal I/V$_{PHASE}$ is modified by the phase shifting signal I/V$_\Phi$ using multiplication, division, summation, or combinations thereof.

15. The method as claimed in claim 1 wherein a nominal phase matching condition is maintained by monitoring optical emission power and utilizing an external power feedback loop to control the phase section of the semiconductor laser.

16. The method as claimed in claim 1 wherein a nominal phase matching condition is maintained by utilizing one or more temperature sensors coupled to the laser and the wavelength conversion device in a temperature feedback loop to control the phase section of the semiconductor laser.

17. The method as claimed in claim 1 wherein generating at least a portion of a scanned laser image further comprises coupling an optical signal from the semiconductor laser into the wavelength conversion device to convert the optical signal into higher harmonic waves.

18. The method as claimed in claim 1 wherein:
the optical emission is scanned to generate an image frame comprising a plurality of image lines; and
the plurality of image pixels or encoded data periods are arranged to define the plurality of image lines.

19. The method as claimed in claim 1 wherein:
the method further comprises shifting the optical emission across a plurality of laser cavity modes by applying at least one additional quasi-periodic phase shifting signal I/V$_\Phi$ to the phase section of the semiconductor laser, the at least one additional quasi-periodic phase shifting signal I/V$_\Phi$ having only two distinct drive levels a maximum drive level and a minimum drive level,
the at least one additional quasi-periodic signal transitions periodically between the maximum drive level and the minimum drive level at a frequency that varies randomly over time; and
the quasi-periodic phase shifting signals I/V$_\Phi$ comprise different amplitude profiles.

20. A method of controlling a laser projection system comprising a visible light source, wherein the visible light source comprises a semiconductor laser and a wavelength conversion device, the method comprises:
generating at least a portion of a scanned laser image by configuring the semiconductor laser for optical emission of encoded image data and scanning an output beam of the visible light source across a plurality of image pixels or encoded data periods that are arranged to define an image frame comprising a plurality of image lines, the semiconductor laser comprising a gain section, a phase section and a wavelength selective section;
applying a drive signal I$_{GAIN}$ into the gain section of the semiconductor laser, the drive signal I$_{GAIN}$ comprising a plurality of data portions and corresponding wavelength recovery portions interposed temporally between corresponding data portions, wherein the data portions comprise respective drive amplitudes I$_D$ and drive durations t$_D$, and the wavelength recovery portions comprise recovery amplitudes I$_R$ distinct from the drive amplitudes I$_D$ of the data portions and recovery durations t$_R$ less than the drive durations t$_D$ of the data portion;
maintaining the wavelength of the output beam of the semiconductor laser approximately equal to a phase matching wavelength of the wavelength conversion device by monitoring optical emission power and utilizing an external power feedback loop to control the phase section of the semiconductor laser; and
shifting the optical emission across a plurality of laser cavity modes by applying a plurality of quasi-periodic phase shifting signals I/V$_\Phi$ to the phase section of the semiconductor laser, each of the quasi-periodic phase shifting signal I/V$_\Phi$ having only two distinct drive levels, a respective maximum drive level and a respective minimum drive level, wherein:
the respective quasi-periodic signals transition periodically between the respective maximum drive level and the respective minimum drive level at a frequency that varies randomly over time independently of the drive signal I$_{GAIN}$ applied to the gain section; and
the quasi-periodic phase shifting signals I/V$_\Phi$ comprise different amplitude profiles.

21. A laser projection system comprising a visible light source and at least one laser controller wherein:
the visible light source comprises a semiconductor laser and a wavelength conversion device;
the laser controller is programmed to operate the semiconductor laser;
the laser controller is programmed to generate at least a portion of a scanned laser image by configuring the semiconductor laser for optical emission of encoded image data and scanning an output beam of the visible light source across a plurality of image pixels or encoded data periods, the semiconductor laser comprising a gain section, a phase section, and a wavelength selective section; and
the laser controller is programmed to shift the optical emission across a plurality of laser cavity modes by applying a quasi-periodic phase shifting signal I/V$_\Phi$ to the phase section of the semiconductor laser, the quasi-periodic phase shifting signal I/V$_\Phi$ having only two distinct drive levels, a maximum drive level and a minimum drive level, wherein the quasi-periodic signal transitions periodically between the maximum drive level and the minimum drive level at a frequency that varies randomly over time independently of a drive signal I$_{GAIN}$ applied to the gain section.

22. A method of controlling a laser projection system comprising a visible light source, wherein the visible light source comprises a semiconductor laser and a wavelength conversion device, the method comprises:
generating at least a portion of a laser image by emitting an output beam of the visible light source, the semiconductor laser comprising a gain section, a phase section, and a wavelength selective section; and
shifting an optical emission of the semiconductor laser across a plurality of laser cavity modes by applying a quasi-periodic phase shifting signal I/V$_\Phi$ to the phase section of the semiconductor laser, the quasi-periodic phase shifting signal I/V$_\Phi$ having only two distinct drive levels, a maximum drive level and a minimum drive level, wherein the quasi-periodic signal transitions periodically between the maximum drive level and the minimum drive level at a frequency that varies randomly over time independently of a drive signal I$_{GAIN}$ applied to the gain section.

23. The method as claimed in claim 22 wherein the laser projection system is a scanning based system or a non-scanning spatial light modulation based system.

* * * * *